United States Patent
Tanaka et al.

[11] Patent Number: 5,972,236
[45] Date of Patent: Oct. 26, 1999

[54] ETCHANT, ETCHING METHOD USING THE SAME, AND RELATED ETCHING APPARATUS

[75] Inventors: Hiroshi Tanaka, Toyokawa; Yoshitsugu Abe, Anjo; Motoki Ito, Nagoya; Kazuyuki Inoue, Owariasahi; Satoru Kosaka, Aichi-ken, all of Japan

[73] Assignee: Denso Corporation, Kariya, Japan

[21] Appl. No.: 08/907,907

[22] Filed: Aug. 11, 1997

[30] Foreign Application Priority Data

| Aug. 12, 1996 | [JP] | Japan | 8-231515 |
| Jun. 30, 1997 | [JP] | Japan | 9-190693 |
| Jun. 30, 1997 | [JP] | Japan | 9-190694 |

[51] Int. Cl.$^6$ ............................................. B44C 1/22
[52] U.S. Cl. ........................ 216/86; 216/93; 216/99; 134/1.3; 438/10
[58] Field of Search .................... 216/93, 99, 86; 134/1.3; 438/10

[56] References Cited

U.S. PATENT DOCUMENTS 4,859,280  8/1989  Lowry et al. .................... 156/662

FOREIGN PATENT DOCUMENTS

| 64-042824 | 2/1989 | Japan . |
| 1-154523 | 6/1989 | Japan . |
| 6-097153 | 4/1994 | Japan . |
| 7-007000 | 1/1995 | Japan . |
| 7-166373 | 6/1995 | Japan . |
| 7-169727 | 7/1995 | Japan . |

OTHER PUBLICATIONS

"Influence of Metallic Impurities On SC–1 Cleaning", Sugihara et. al., Semicond. Pure $H_2O$ Chem. Conference (1993), 12th, Abstract only.

"Determination of Trace Elements by Stripping Voltammetry"; Shaneshwar et. al., 1983, Trace Anal. Tech. Dev.

"Influence of Metallic Impurities on SC–1 Cleaning", Semiconductor Pure Water Chem Conf; 12th; pp. 66–81; Sugihara et. al, 1993.

Nakamura et al: "Novel Electrochemical Micro–Machining and Its Application for Semiconductor Acceleration Sensor IC" Transducers 1987, pp. 112–115.

Primary Examiner—William Powell
Assistant Examiner—George Goudreau
Attorney, Agent, or Firm—Pillsbury Madison & Sutro LLP

[57] ABSTRACT

A silicon substance is etched by using alkaline etchant containing additive (Cu, Pb, Mg). The content of the additive is controlled intentionally to provide desired etching quality during an etching operation.

39 Claims, 17 Drawing Sheets

Si (110) SURFACE (×1000)

(×2000)

ETCHANT, ETCHING METHOD USING THE SAME, AND RELATED ETCHING APPARATUS

BACKGROUND OF THE INVENTION

1. Field of the Invention

The present invention relates to etchant used in a wet etching operation for manufacturing a silicon product, such as a silicon wafer. Furthermore, the present invention relates to an etching method using this etchant and a related etching apparatus.

2. Related Art

A conventionally known product manufactured from a silicon wafer is a silicon diaphragm which is incorporated in a pressure sensor, an acceleration sensor, or the like. An electric resistance circuit is formed along the surface of this silicon diaphragm. Distortion of the silicon diaphragm is electrically detected as a signal representing a pressure or an acceleration applied on the diaphragm. Usually, the silicon diaphragm is manufactured by wet etching. Another conventional silicon products comprise a silicon beam and a silicon nozzle.

SUMMARY OF THE INVENTION

An object of the present invention is to provide a silicon product having a desired size (e.g., a silicon wafer having a uniform thickness).

As another object, the present invention stabilizes the surface roughness of the etched silicon product even when the thickness of the used silicon wafer is thin (e.g., less than 20 $\mu$m).

According to still another object, the present invention intentionally controls the etching rate, the size or shape of a designated portion (e.g., thickness of the diaphragm portion) of the silicon product, or the surface roughness.

In order to accomplish this and other related objects, the present invention provides etchant used for etching a silicon product, an etching method using this etchant, and a related etching apparatus. Various aspects of the present invention will be described hereinafter with reference to the numerals in parentheses which show the correspondence to the components disclosed in the preferred embodiments of the present invention described later. Reference numerals in parentheses, added in the following description, are merely used for the purpose of facilitating the understanding to the present invention and not used for narrowly interpreting the scope of claims of the present invention.

A first aspect of the present invention provides an etching method for etching a silicon substance (1; 111) by using alkaline etchant (41; 100) containing additive and controlling the content of the additive during an etching operation.

The alkaline etchant of the present invention include KOH (potassium hydroxide), hydrazine, EDP (ethylene-diamine-pyrocatechol), TMAH (tetramethylammonium hydroxide) solutions.

Preferably, the additive comprises metallic components adsorbable on a silicon surface by interaction between them. The metallic components include Cu (copper), Mg (magnesium), Pb (lead), Sn (tin), and Ag (silver). Preferably, at least one of the metallic components is selected from the group consisting of Cu, Pb and Mg.

Preferably, the additive has an oxidation-reduction potential (FIG. 12) higher than that of hydrogen (H) produced during the etching operation. For example, a desirable additive is Cu. The oxidation-reduction potential is measured in the alkaline etchant.

Preferably, the additive has an oxidation-reduction potential (FIG. 12) lower than that of hydrogen (H) produced during the etching operation but higher than that of Ni, and the additive causes repetitive ionization and deposition. For example, a desirable additive is Pb.

Preferably, the additive forms colloidal hydroxide in the alkaline etchant. For example, a desirable additive is Mg.

Preferably, the alkaline etchant contains potassium hydroxide (KOH).

Preferably, the content of Cu is controlled to a value lower than 0.1 ppm. Alternatively, the content of Cu is controlled to a value higher than 0.3 ppm. The content of Pb is controlled to a range of 0.1 ppm to 2 ppm. The content of Mg is controlled to a value lower than 1 ppm. Alternatively, the content of Mg is controlled to a value higher than 1 ppm.

Preferably, Mg is added to the alkaline etchant when the content of Cu exceeds 100 ppb.

Preferably, the additive contained in the alkaline etchant is measured (steps S2 to S4), and the content of the additive is controlled based on a measured value during the etching operation (steps S5 to S8). The temperature and concentration of the alkaline etchant are controlled to predetermined values. A stripping voltammetry method may be used to measure the additive in the etchant. The measurement of the additive according to the stripping voltammetry method is performed by sampling the alkaline etchant (step S2), adjusting pH of the sampled etchant to a range of pH 2 to 6 by adding pH conditioner (step S3), and measuring the additive contained in the sampled alkaline etchant (step S4). The sampled etchant is stirred during the measurement of the additive according to the stripping voltammetry method.

Preferably, the alkaline etchant contains potassium hydroxide (KOH), and the pH conditioner is hydrochloric acid (HCl). The measured additive is selected from the group consisting of Cu, Pb and Mg.

Preferably, the additive is Cu, and Mg is added to the alkaline etchant based on a measured value of Cu.

A second aspect of the present invention provides an etching apparatus (101) for etching a silicon material (111) by using alkaline etchant. An etching tank (110) stores alkaline etchant (100). An impurity measuring device (102) measures the content of impurity contained in the alkaline etchant. And, an impurity conditioning device (112) controls the content of the impurity based on a measured value of the impurity measuring device during an etching operation.

Preferably, the impurity measuring device (102) measures the impurity by a stripping voltammetry method. More specifically, the impurity measuring device (102) samples the alkaline etchant (100), adjusts pH of the sampled etchant to a range of pH 2 to 6 by adding pH conditioner (290), and measures the impurity contained in the sampled alkaline etchant. The sampled etchant is stirred during the measurement of the impurity according to the stripping voltammetry method.

Preferably, the alkaline etchant contains potassium hydroxide (KOH), and the pH conditioner (290) is hydrochloric acid (HCl). The measured impurity is selected from the group consisting of Cu, Pb and Mg. For example, the measured impurity is Cu, and Mg is added to the alkaline etchant based on a measured value of Cu.

A third aspect of the present invention provides an etchant (100) used for etching a silicon wafer (111), wherein the etchant is alkaline solution containing metallic component adsorbable on a silicon surface.

Preferably, the metallic component is selected from the group consisting of Cu, Pb and Mg. For example, the metallic component is Cu whose content is larger than 0.3 ppm. The metallic component is Pb whose content is in a range of 0.1 ppm to 2 ppm. Or, the metallic component is Mg whose content is larger than 1 ppm.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the present invention will be explained hereinafter with reference to accompanied drawings.

First Embodiment

A method for etching a silicon wafer in accordance with a first embodiment and etching liquid used in this etching operation will be explained with reference to FIGS. 1 and 6.

Figure 1A:
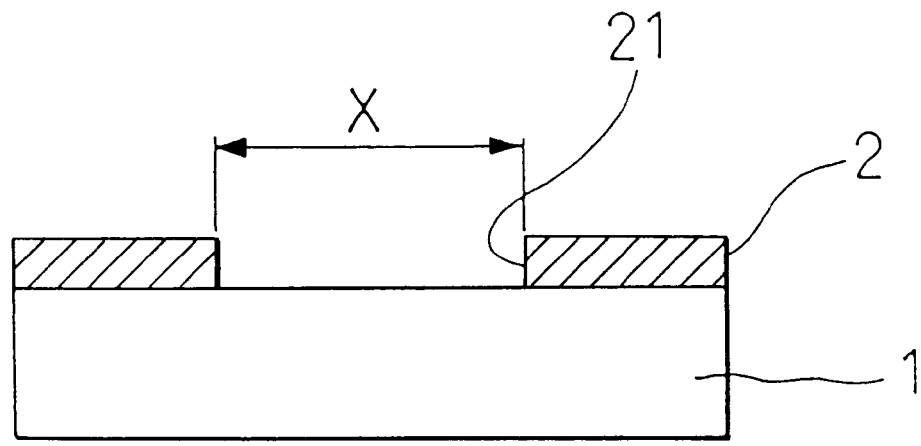
FIGS. 1A and 1B are cross-sectional views illustrating an etching operation for manufacturing a silicon diaphragm in accordance with a first embodiment of the present invention.
Figure 1B:
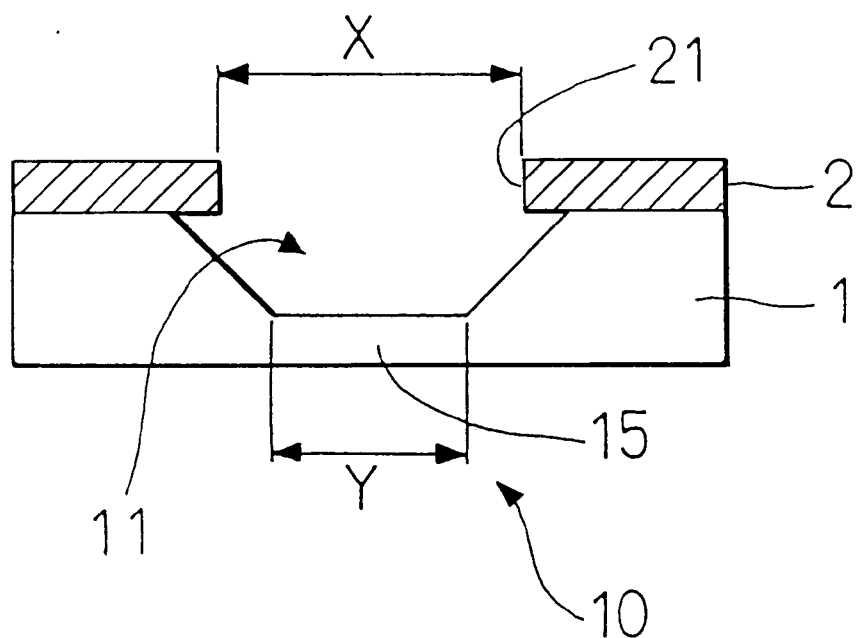

A silicon diaphragm 10 (refer ro FIG. 1B) is manufactured in the first embodiment. An upper surface of the silicon wafer 1 is a silicon (110) surface. The silicon (110) surface is referred to as Si(110) surface, hereinafter. As shown in FIG. 1A, an etching mask 2 is placed on the upper surface of the silicon wafer 1. The etching mask 2 has an opening 21. The Si (110) surface of silicon wafer 1 is exposed to etching liquid through this opening 21. Slant surfaces are formed as the etching operation advances as shown in FIG. 1B. The formed slant surfaces are silicon (100) surfaces. The silicon (100) surface is referred to as Si (100) surface, hereinafter. A reversed trapezoidal recess 11 is formed on the silicon wafer 1. Finally, a silicon diaphragm 10 having a diaphragm portion 15 is formed.

The silicon diaphragm 10 has a formation ratio Y/X in a range of 0.75 to 1.10, when X represents the width of the opening 21 of the etching mask 2 and Y represents the width of the diaphragm portion 15.

FIGS. 2A–2F, 3 and 4 cooperatively show the details of a manufacturing process of the above-described silicon diaphragm 10.

Figure 2A:
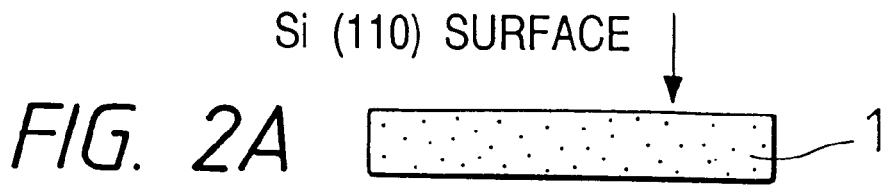
FIGS. 2A to 2F are views cooperatively illustrating the details of a manufacturing process for the silicon diaphragm in accordance with the first embodiment of the present invention.
Figure 2B:
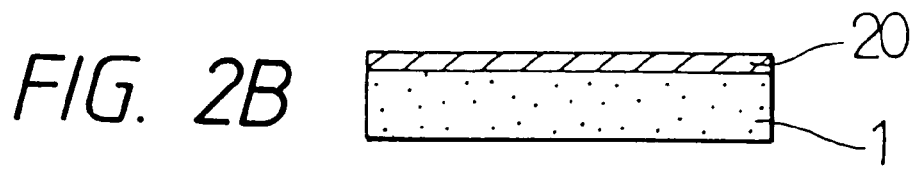

First, the silicon wafer 1 is prepared as shown in FIG. 2A. Next, a mask material 20 of SiN or $SiO_2$ is coated entirely on the upper surface of the Si (110) surface of the silicon wafer 1, as shown in FIG. 2B. Then, the etching mask 2 is formed by photolithography.

Figure 2C:
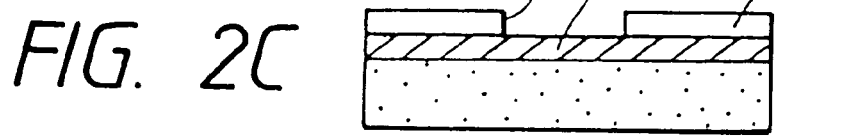
Figure 2D:
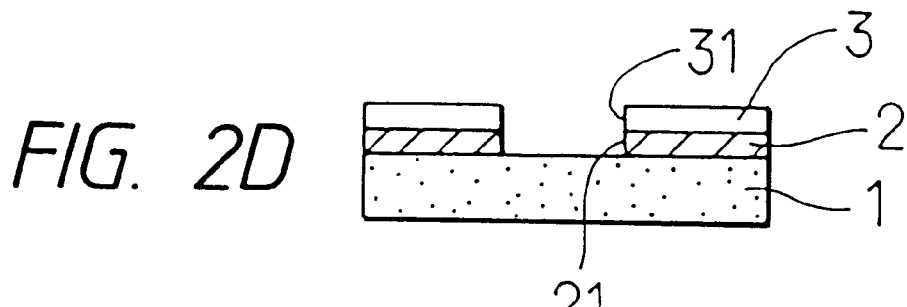

More specifically, as shown in FIG. 2C, a photo-resist film 3 is accumulated on the mask material 20. The photo-resist film 3 has an opening 31. Light is irradiated from above for the development of the mask material 20. Subsequently, the mask material 20 is cleaned by acid-group etchant. A part of the mask material 20, which was irradiated by the light, is removed by the applied acid-group etchant. Thus, the etching mask 2 having the opening 21 is formed on the silicon wafer 1 as shown in FIG. 2D. Thereafter, the photo-resist film 3 is removed off the etching mask 2.

Figure 2E:
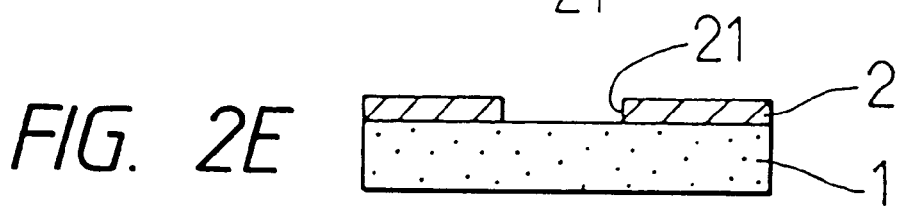
Figure 2F:
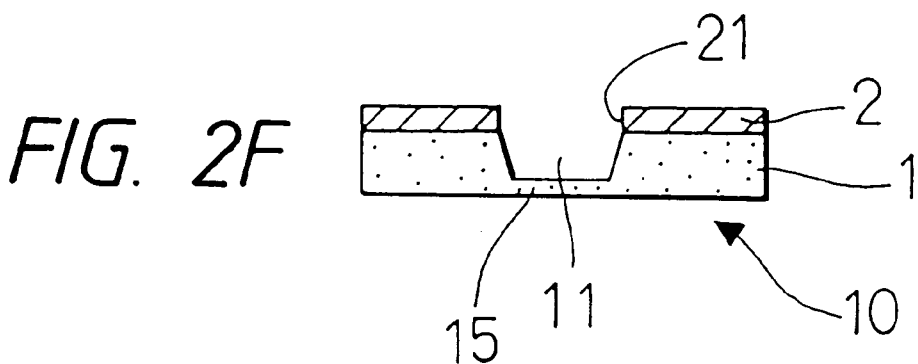

As shown in FIG. 2E, the upper surface of the silicon wafer 1 is exposed through the opening 21 of the etching mask 2. Etchant is applied to the exposed part of the silicon wafer 1 to form the above-described recess 11 shown in FIG. 1B. As the etching operation advances, the depth of the recess 11 is increased. Finally, the silicon diaphragm 10 having the diaphragm portion 15 is manufactured, as shown in FIG. 2F.

Figure 4:
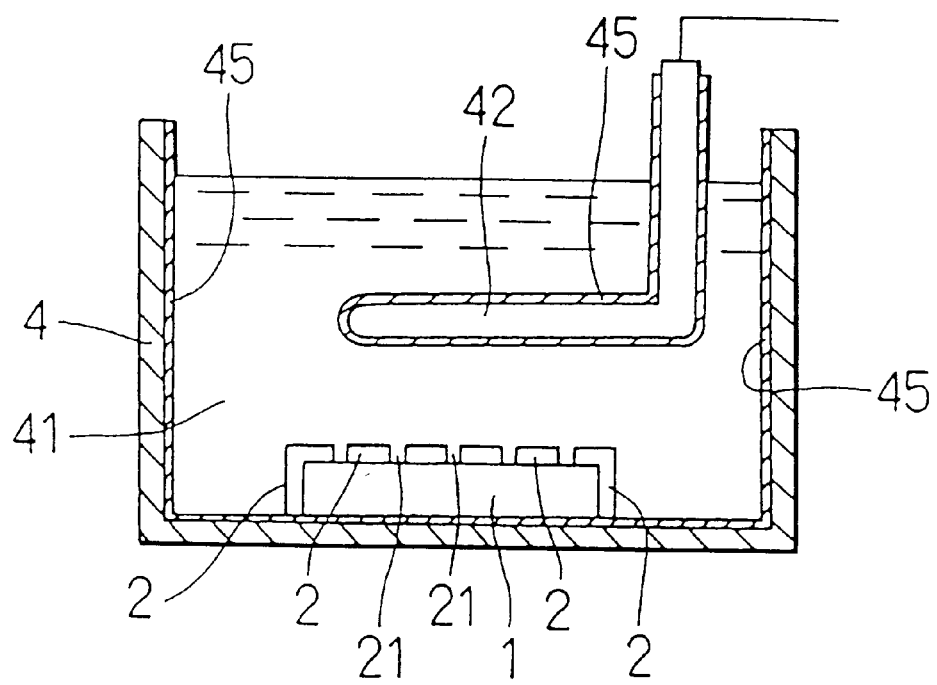
FIG. 4 is a cross-sectional view showing an etching tank used in the first embodiment of the present invention.

FIG. 4 shows an etching tank 4 used for manufacturing the silicon diaphragm 10. The etching tank 4 is filled with etchant 41. A heater 42 is immersed in the etchant 41. The silicon wafer 1 covered with the etching mask 2 is placed on the bottom of the etching tank 4. Both the inner wall of etching tank 11 and the surface of heater 14 are coated by coating material 45 which includes polytetrafluoroethylene. With the provision of the coating material 45, all of metallic part of the etching tank 11 and the heater 14 can be completely isolated from the etchant 41.

According to the first embodiment of the present invention, a plurality of silicon diaphragms are manufactured simultaneously on a disk-like silicon wafer having a diameter of 100 cm.

Figure 3:
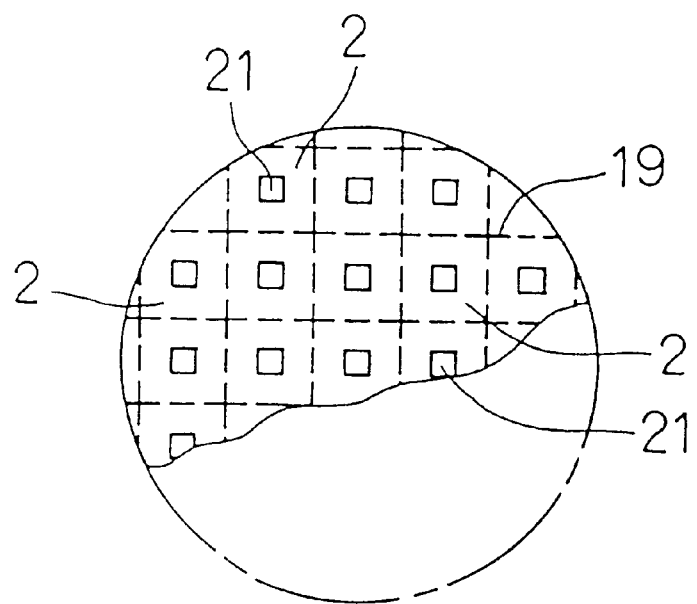
FIG. 3 is a plan view showing a silicon wafer used in the first embodiment of the present invention.

As shown in FIG. 3, the etching mask 2 is placed on the upper surface of the disk-like silicon wafer. A plurality of openings 21 of the etching mask 2 are arranged in a matrix. Each opening 21 determines the position of a diaphragm portion of a produced silicon diaphragm. A dotted line 19 represents a cutting line for dividing or dissecting the disk-like silicon wafer 1 into a plurality of silicon diaphragms 10.

As shown in FIG. 4, the upper and side surfaces of the silicon wafer 1 are entirely covered by the etching mask 2 except for the portions corresponding to the openings 21. The silicon wafer 1 is immersed in the etchant 41.

Figure 5:
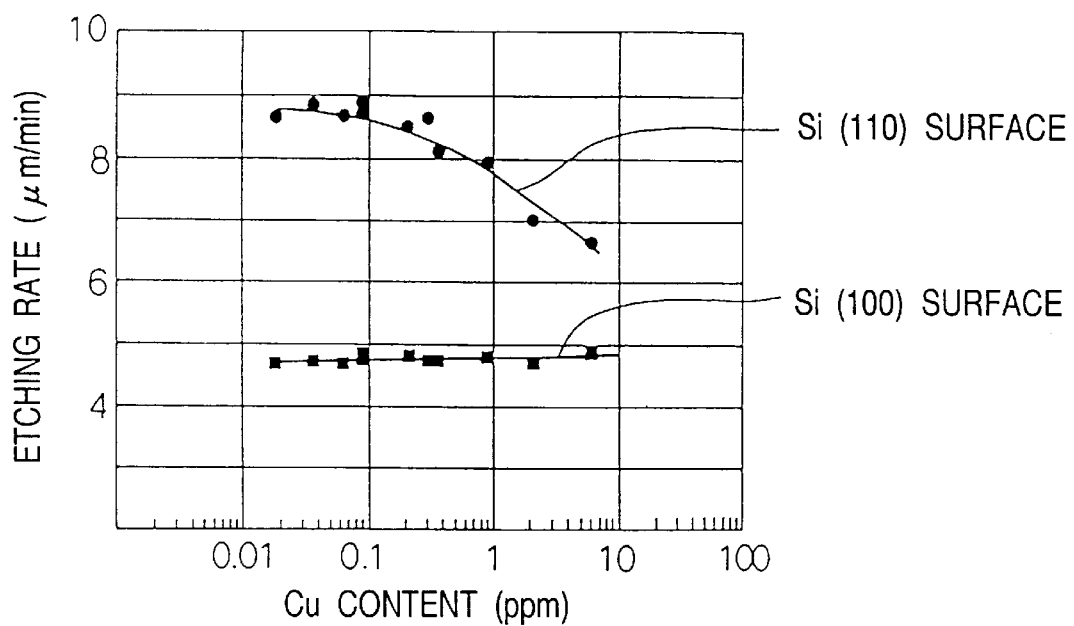
FIG. 5 is a graph showing a relationship between Cu content and etching rate in accordance with the first embodiment of the present invention.

According to the first embodiment, the etchant includes Cu as additive. More specifically, the used etchant is 32 wt % KOH (i.e., potassium hydroxide) solution which is alkaline etchant. The etching was performed at a temperature of 110° C. These settings, i.e., 32 wt % KOH and 110° C., are determined from the optimum etching conditions for manufacturing a silicon diaphragm. Metallic standard liquid for atomic absorption analysis was used for adding Cu into the etchant. An experiment was conducted by changing the Cu content in the etchant. The etching rate ($\mu$m/min) was measured at each of the Si (110) surface and the Si (100) surface. FIG. 5 is a graph showing the result of the experiment.

In the graph of FIG. 5, an upper curve represents an etching rate of the Si (110) surface and a lower curve represents an etching rate of the Si (100) surface. In FIG. 5, an abscissa is a logarithmic scale showing the content of Cu (ppm) and an ordinate is a linear scale showing the etching rate ($\mu$m/min).

As understood from FIG. 5, the etching rate of the Si (110) surface is faster than the etching rate of the Si (100) surface. This is why the reversed trapezoidal recess 11 is formed on the silicon wafer 1 as shown in FIG. 1B. As a result, the silicon diaphragm 10 having the diaphragm portion 15 is fabricated.

The etching rate of the Si (110) surface varies depending on the content of the added Cu. The etching rate of the Si (110) surface decreases with increasing amount of the additive Cu. On the contrary, the etching rate of the Si (100) surface remains constant. Hence, a ratio of the etching rate of the Si (110) surface and the etching rate of the Si (100) surface is variable.

In other words, the etching rate ratio between the Si (100) surface and the Si (110) surface can be flexibly controlled by changing the Cu content in the etchant. The shape of the above-described trapezoidal recess 11 can be flexibly and intentionally controlled by adjusting the Cu content.

Figure 6:
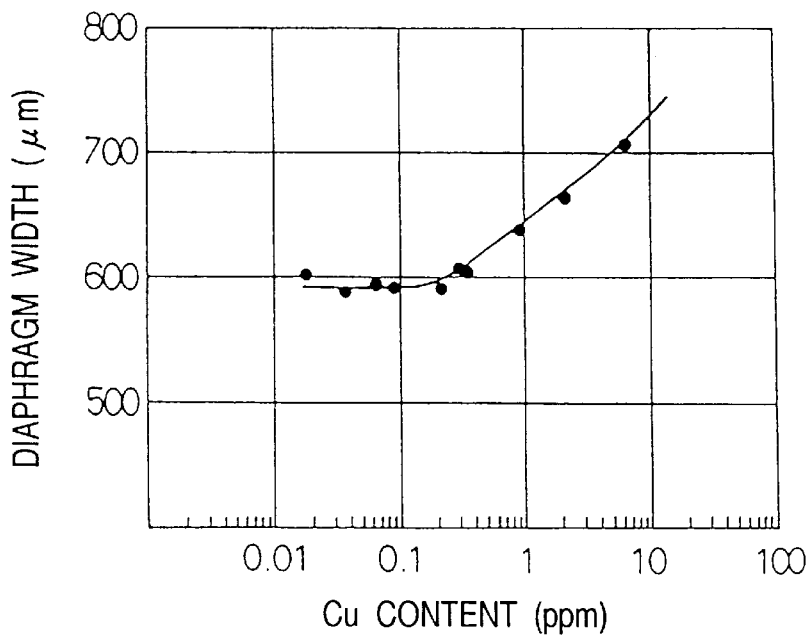
FIG. 6 is a graph showing a relationship between the Cu content and the width of a resultant diaphragm portion in accordance with the first embodiment of the present invention.

FIG. 6 is a graph showing width ($\mu$m) of a resultant diaphragm portion 15 in relation to the Cu content, obtained when the opening 21 of the etching mask 2 is 740 $\mu$m in width.

As understood from the graph of FIG. 6, when the Cu content is equal to or smaller than 0.2 ppm, silicon diaphragms having the same diaphragm size (e.g., width) can be constantly manufactured. The resultant silicon diaphragms have a diaphragm portion having a width of approximately 590 $\mu$m. In other words, the formation ratio Y/X of the resultant silicon diaphragm is approximately 0.8 (i.e., X=740 $\mu$m and Y=590 $\mu$m).

However, in the remaining region where the Cu content exceeds 0.2 ppm, the width of the diaphragm portion can be flexibly and explicitly changed by controlling the Cu content. Preferably, an upper limit of Cu content is 100 ppm. With the setting of such an upper limit, no residual component of Cu will be found on the silicon surface after the etching operation is finished and the silicon surface is cleaned.

As explained above, according to the above-described first embodiment, the size or shape of the etched recess can be flexibly changed by controlling the Cu content. Thus, the formation ratio (Y/X) of the diaphragm width Y of the resultant silicon diaphragm to the opening width X of the etching mask can be controlled arbitrarily and intentionally.

Second Embodiment

A second embodiment of the present invention will be explained with reference to FIGS. 7 to 9. According to the second embodiment, etchant includes Mg as additive. Like the first embodiment, metallic standard liquid for atomic absorption analysis is used for adding Mg into the etchant. The rest of the arrangement and operation is identical with those disclosed in the first embodiment.

Figure 7:
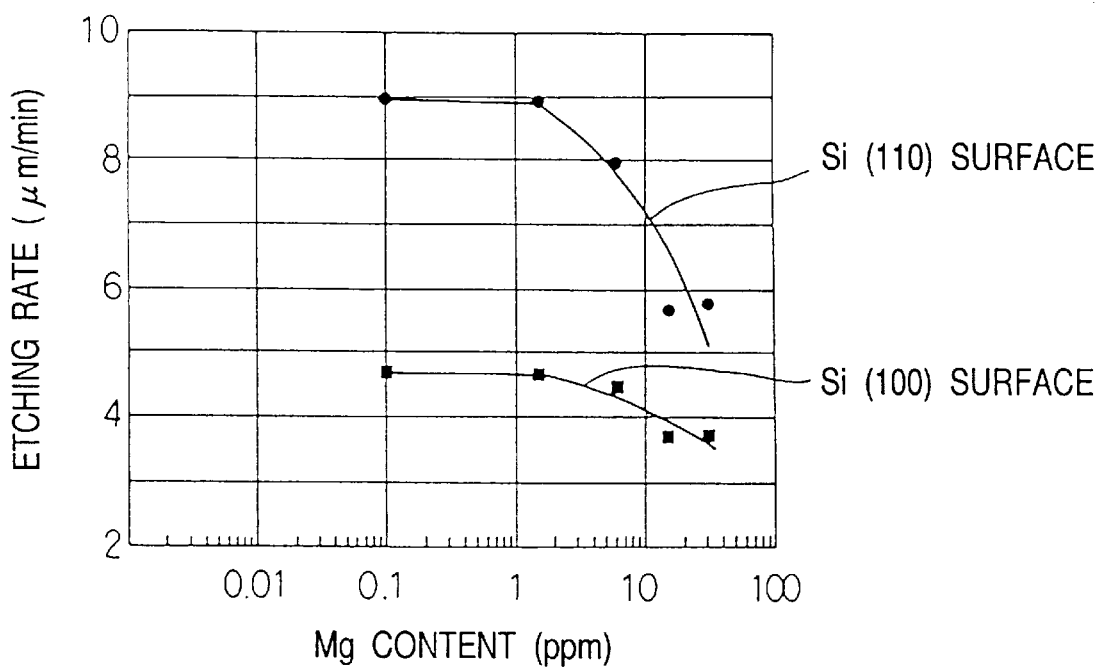
FIG. 7 is a graph showing a relationship between Mg content and etching rate in accordance with a second embodiment of the present invention.

FIG. 7 is a graph showing etching rate ($\mu$m/min) in relation to content of Mg (ppm). An upper curve represents an etching rate of the Si (110) surface and a lower curve represents an etching rate of the Si (100) surface. FIG. 8 is a graph showing a ratio of the etching rate of the Si (100) surface to the etching rate of the Si (110) surface in relation to the content of Mg (ppm).

Figure 8:
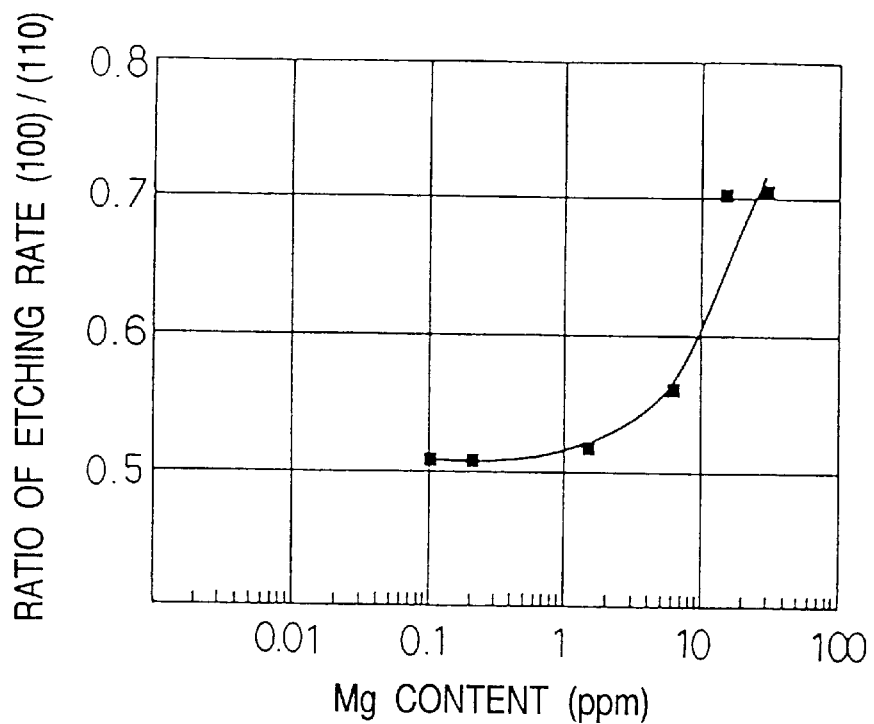
FIG. 8 is a graph showing a relationship between Mg content and ratio of etching rate in accordance with the second embodiment of the present invention.

As understood from FIGS. 7 and 8, the etching rate of the Si (110) surface is faster than the etching rate of the Si (100) surface. As a result, the silicon diaphragm 10 having the diaphragm portion 15 is fabricated as shown in FIG. 1B. The etching rate ratio of the Si (100) surface to the Si (110) surface increases with increasing Mg content.

Figure 9:
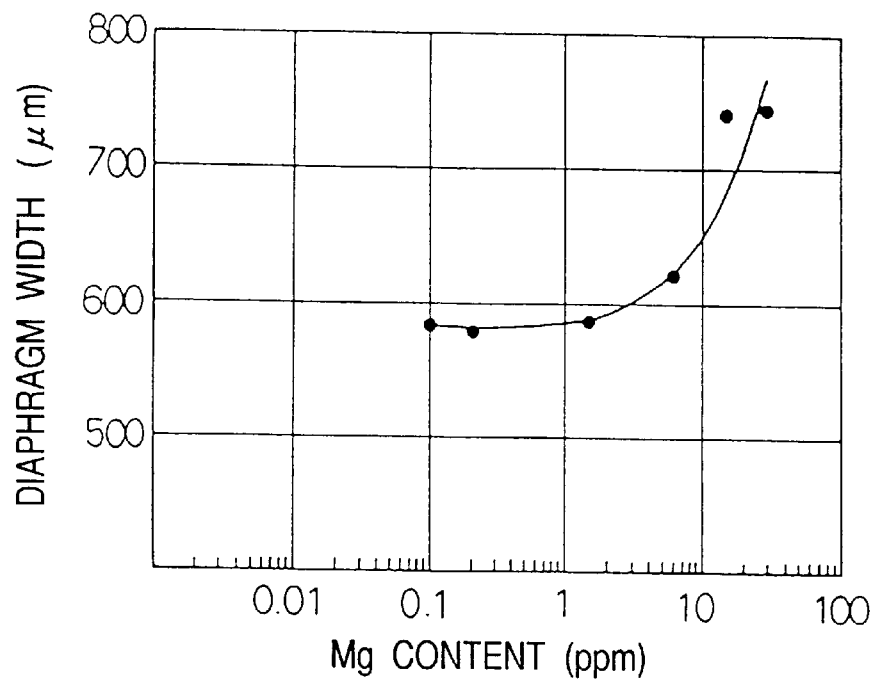
FIG. 9 is a graph showing a relationship between the Mg content and the width of a resultant diaphragm portion in accordance with the second embodiment of the present invention.

FIG. 9 is a graph showing the width (μm) of a resultant diaphragm portion 15 in relation to the Mg content, obtained when the opening 21 of the etching mask 2 is 1,000 μm in width.

As understood from the graph of FIG. 9, when the Mg content is equal to or smaller than 1.5 ppm, silicon diaphragms having the same diaphragm size (e.g., width) can be constantly manufactured. On the other hand, in the remaining region where the Mg content exceeds 1.5 ppm, the width of the diaphragm portion can be flexibly changed by controlling the Mg content. Preferably, an upper limit of Mg content is 100 ppm. With the setting of such an upper limit, no residual component of Mg will be found on the silicon surface after the etching operation is finished and the silicon surface is cleaned.

As explained above, according to the above-described second embodiment, the size and shape of the etched recess can be flexibly and intentionally changed by controlling the Mg content. Thus, the formation ratio (Y/X) of the diaphragm width Y of the resultant silicon diaphragm to the opening width X of the etching mask can be controlled arbitrarily and intentionally.

Third Embodiment

A third embodiment of the present invention will be explained with reference to FIGS. 10 and 11. According to the third embodiment, etchant includes Pb as additive. Like the first embodiment, metallic standard liquid for atomic absorption analysis is used for adding Pb into the etchant. The rest of the arrangement and operation is identical with those disclosed in the first embodiment.

Figure 10:
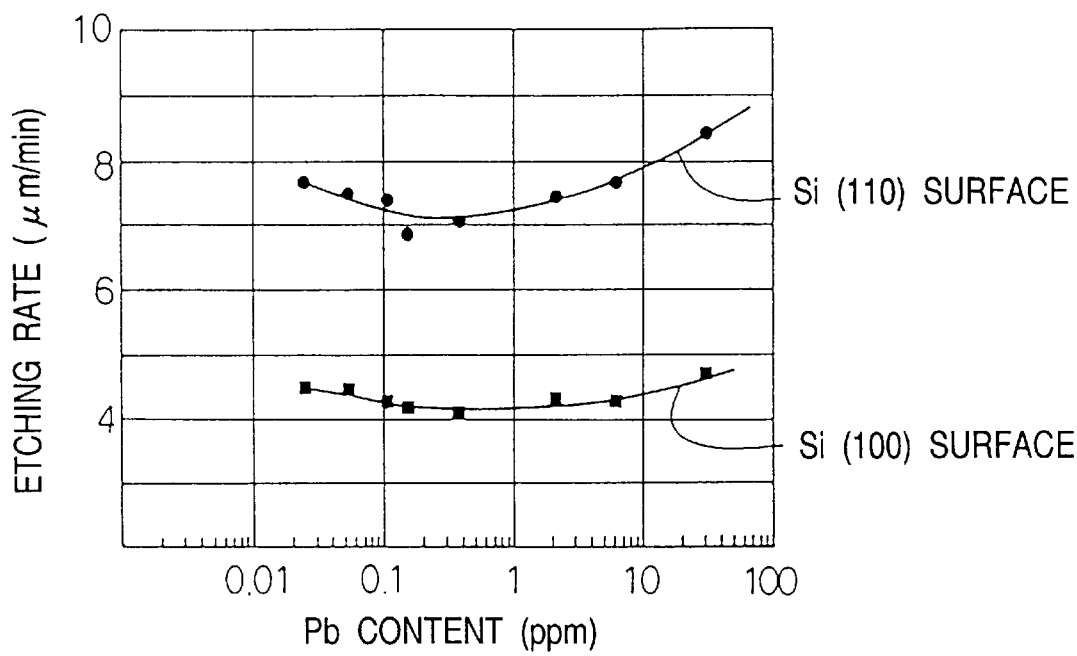
FIG. 10 is a graph showing a relationship between Pb content and etching rate in accordance with a third embodiment of the present invention.

FIG. 10 is a graph showing etching rate (μm/min) in relation to the content of Pb (ppm). An upper curve represents an etching rate of the Si (110) surface and a lower curve represents an etching rate of the Si (100) surface. As understood from FIG. 10, the etching rate of the Si (110) surface is faster than the etching rate of the Si (100) surface. As a result, the silicon diaphragm 10 having the diaphragm portion 15 is fabricated as shown in FIG. 1B.

Figure 11:
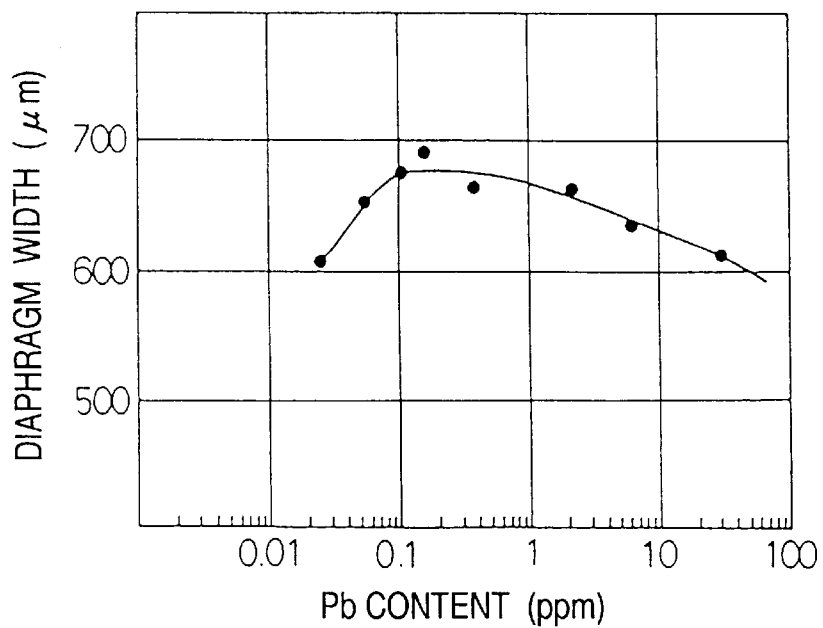
FIG. 11 is a graph showing a relationship between the Pb content and the width of a resultant diaphragm portion in accordance with the third embodiment of the present invention.

FIG. 11 is a graph showing the width (μm) of a resultant diaphragm portion 15 in relation to the Pb content, obtained when the opening 21 of the etching mask 2 is 1,000 μm in width. As understood from the graph of FIG. 11, it is apparent that the width of the diaphragm portion can be flexibly changed by controlling the Pb content. Preferably, an upper limit of Pb content is 100 ppm. With the setting of such an upper limit, no residual component of Pb will be found on the silicon surface after the etching operation is finished and the silicon surface is cleaned.

As understood from the graph of FIG. 11, when the Pb content is in a range of 0.1 to 2 ppm, the width of the resultant diaphragm portion of the silicon diaphragm is stabilized or constant. In other words, the width of the diaphragm portion can be precisely controlled in this region. Dispersion of the diaphragm portion can be suppressed.

Preferably, the etching operation using Pb additive is performed in a closed system considering an adverse influence to the environments.

Figure 12:
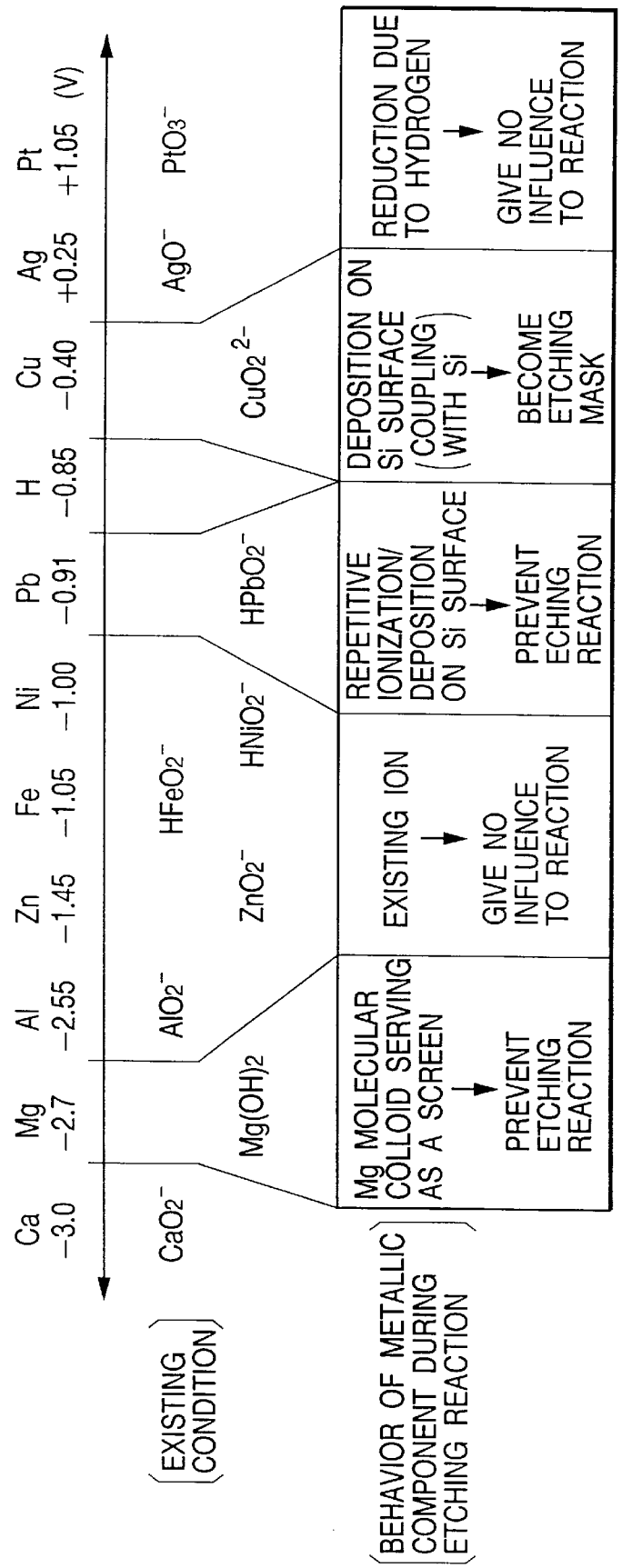
FIG. 12 is a view showing oxidation-reduction potentials of various metal elements and illustrating conditions during the etching operation.

Now referring to FIG. 12, the mechanism of the above-described effects of the first to third embodiments brought by metallic additives Cu, Pb and Mg will be explained. FIG. 12 shows oxidation-reduction potentials of hydrogen (H) and ten other metal elements in (strong base) etchant, together with the existing condition and the behavior of each metallic component during an etching reaction.

As understood from FIG. 12, Cu is nobler than H. On the surface of the silicon wafer, hydrogen (H) is produced during the etching reaction. Accordingly, Cu is reduced by the hydrogen produced during the etching reaction. Cu is deposited on the surface of the silicon wafer.

The deposition of Cu serves as a masking film or membrane which suppresses the etching reaction. The condition of the Cu deposition varies depending on the Cu content. Therefore, effect of Cu suppressing the etching reaction can be controlled by adjusting the Cu content. In other words, both the etching rate and the surface roughness can be controlled intentionally by varying the Cu content.

Like Cu, an oxidation-reduction potential of Ag is higher than that of H. However, Ag does not give substantial influence to the etching reaction because Ag reduces easier than Cu. Ag ion is reduced by H in the etchant before the Ag ion reaches the silicon wafer surface.

As shown in FIG. 12, Pb has an oxidation-reduction potential substantially the same but slightly lower than that of H. Accordingly, it is believed that Pb causes repetitive oxidation-reduction reactions with hydrogen on the silicon wafer surface. In other words, Pb stays on the silicon wafer surface and reduces the etching rate by suppressing the dissolving reaction of Si.

Metal elements baser than H, such as Zn, exist as ion in the etchant. Hence, it is believed that substantial influence is not given to the etching reaction by these metal elements.

The reason why Ag and Zn give no influence to the etching reaction while Pb and Cu give substantial influence is believed that the oxidation-reduction potentials of Pb and Cu are very closer to that of hydrogen produced during the etching reaction. Even a small amount (ppb order) of Pb and Cu can give substantial influence to the etching reaction.

Mg has an oxidation-reduction potential differs greatly from that of hydrogen. Thus, the function of Mg additive is not the same as that of Pb or Cu additive. When the etchant includes a relatively large amount of Mg (ppm order), a great amount of colloidal hydroxide is produced in the etchant. The colloidal hydroxide covers the surface of the silicon wafer. Thus, the etching reaction is suppressed effectively. Accordingly, the etching rate can be controlled by adjusting the Mg content.

Fourth Embodiment

Figure 13:
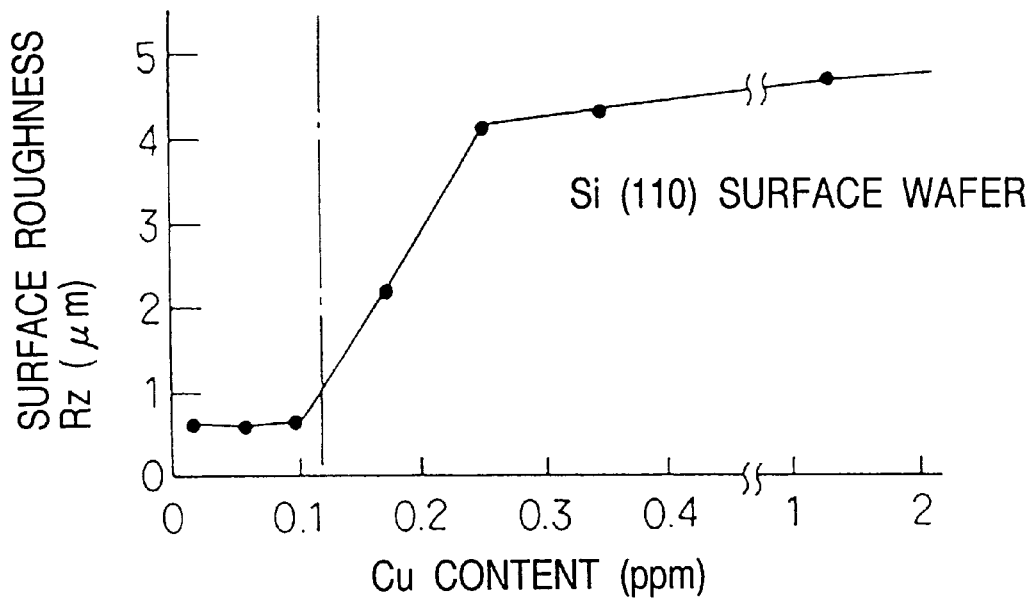
FIG. 13 is a graph showing a relationship between the Cu content and surface roughness in accordance with a fourth embodiment of the present invention.

FIG. 13 shows a relationship between the Cu content in the etchant and the surface roughness of a resultant etched surface, obtained when the etching is applied to the Si (110) surface of the silicon wafer. The used etchant was 32 wt % KOH solution. The etching operation was performed by adding Cu at the temperature of 110° C. for 20 minutes. The Si (110) surface of a silicon wafer was covered by an etching mask having an opening as shown in the first embodiment. Then, the silicon wafer was immersed in the etchant.

Next, the surface roughness of the etched Si (110) surface was measured. In this measurement, a mean surface roughness (Rz) is obtained by averaging measured values measured at ten different points.

FIG. 13 shows the thus obtained surface roughness (Rz) in relation to the Cu content. As understood from FIG. 13, when the Cu content is less than 0.1 ppm, a resultant etched surface is smooth (less than 1 μm in the surface roughness). When the Cu content is in a region of 0.1 to 0.3 ppm, the surface roughness increases explicitly and steeply with increasing Cu content. When the Cu content exceeds 0.3 ppm, the increase of the surface roughness dulls and the surface roughness is stabilized at a larger value. A roughened surface is effective to ensure a connecting strength between the silicon wafer and an opponent material, when the silicon wafer is connected with this opponent material by using organic or inorganic adhesive.

Figure 14:
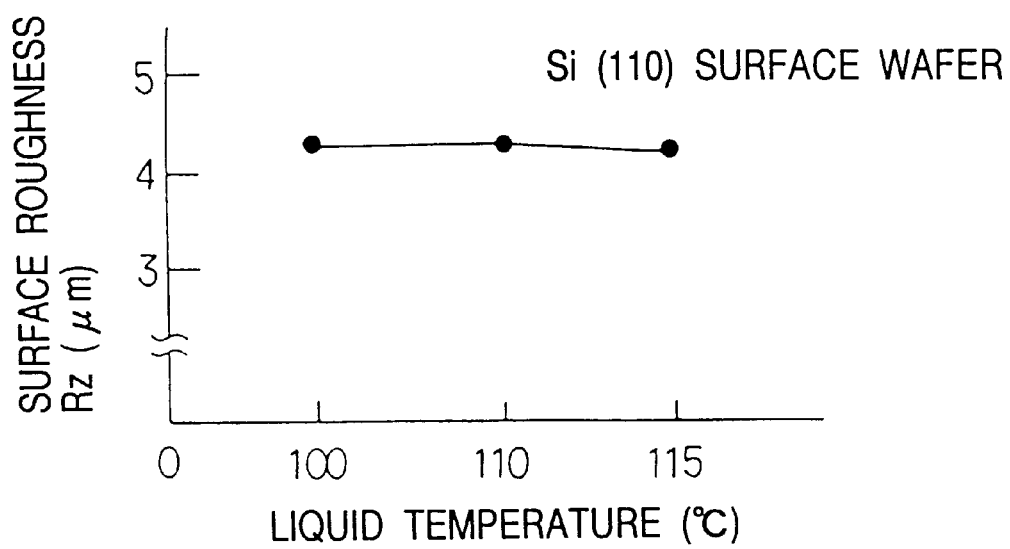
FIG. 14 is a graph showing a relationship between etchant temperature and the surface roughness in accordance with the fourth embodiment of the present invention.

Next, FIG. 14 shows a relationship between the surface roughness and the temperature of the etchant. The etchant, including Cu additive of 0.34 ppm, was prepared at three different temperatures. The surface roughness was measured at each of the setting temperatures. As apparent from the graph of FIG. 14, the surface roughness was about 4.1 μm in each etchant. Numerous pyramid-like projections were recognized on the etched surface, according to the microphotograph (refer to FIGS. 15A and 15B).

Figure 15A:
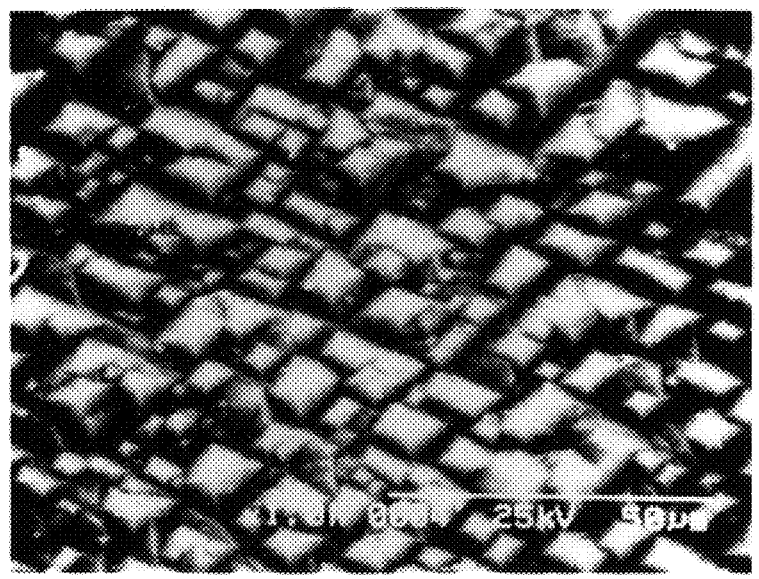
FIGS. 15A and 15B are microscopic photographs showing the details of an etched surface in accordance with the fourth embodiment of the present invention.
Figure 15B:
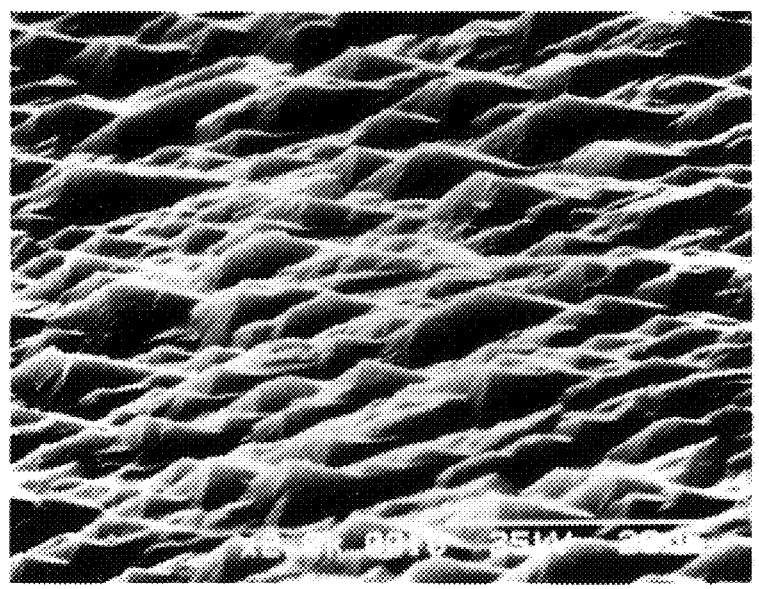

The pyramid-like projections are formed on the etched surface when the Cu content exceeds 0.3 ppm. FIG. 15A is a view taken obliquely from above by the magnification of 1,000, and FIG. 15B is a view taken obliquely from side by the magnification of 2,000.

In this manner, the surface roughness of the etched surface can be controlled intentionally by varying the Cu content.

Figure 16:
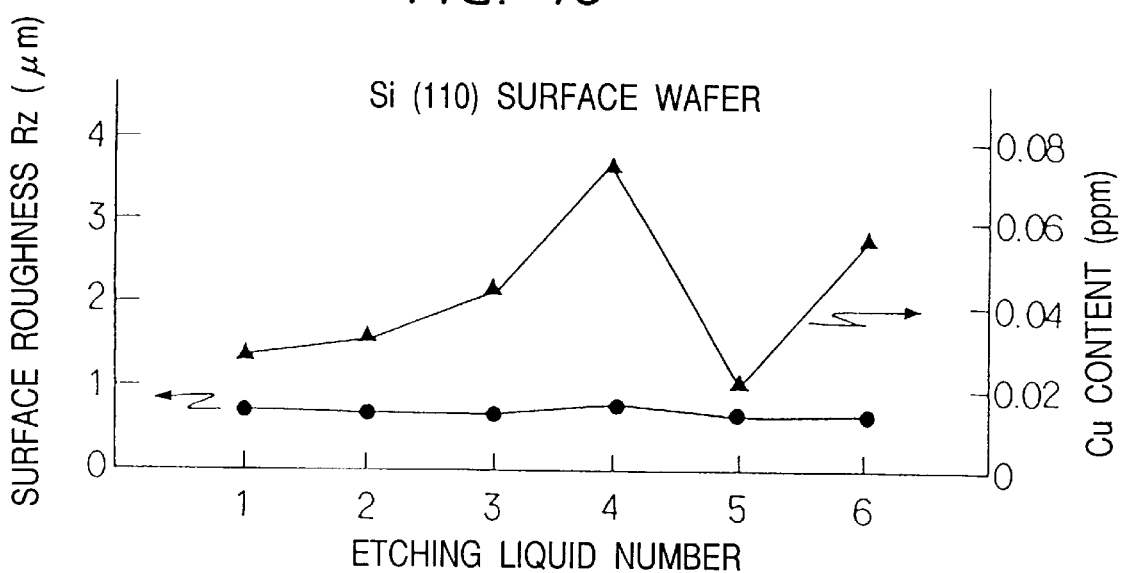
FIG. 16 is a graph showing a relationship between the surface roughness and the Cu content in relation to the lot number of etchant batches in accordance with the fourth embodiment of the present invention.

FIG. 16 is a graph showing the surface roughness of an etched surface in each solution of #1 to #6 etchant batches of 32 wt % KOH prepared at the temperature of 110° C. The Cu content in each solution of the etchant batches is differentiated from the others. As understood from FIG. 16, when the Cu content is in a range of 0.02 to 0.08 ppm, the surface roughness of the etched surface can be controlled to approximately 0.8 μm.

Fifth Embodiment

Figure 17:
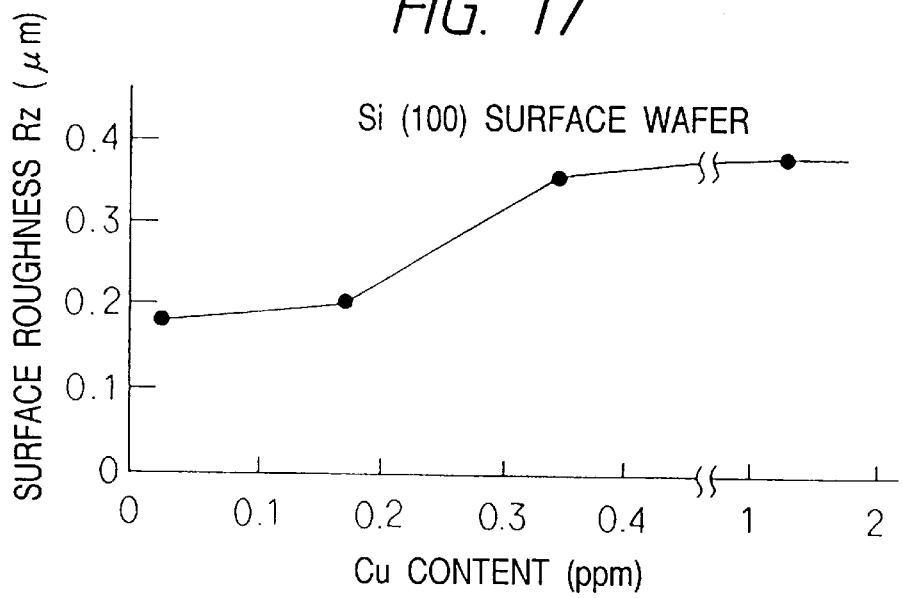
FIG. 17 is a graph showing a relationship between Cu content and surface roughness in accordance with a fifth embodiment of the present invention.
Figure 18:
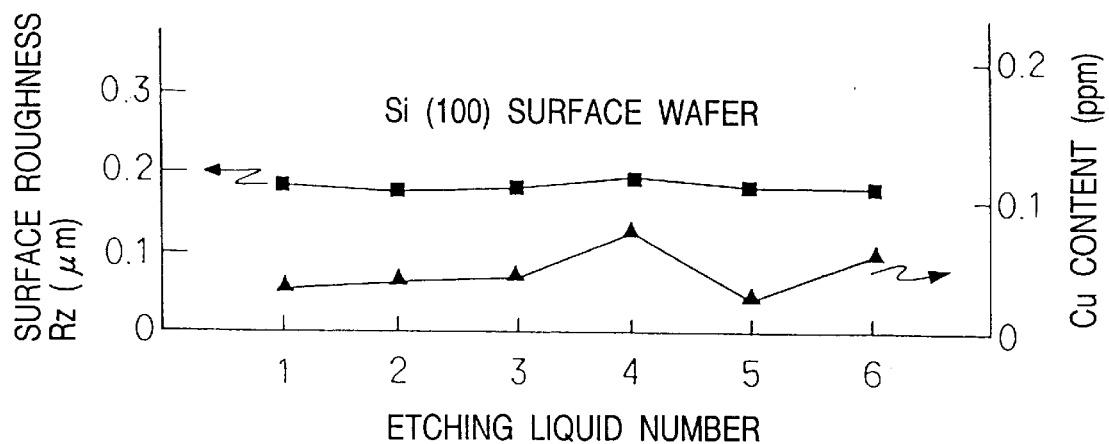
FIG. 18 is a graph showing a relationship between the surface roughness and the Cu content in relation to the lot number of etchant batches in accordance with the fifth embodiment of the present invention.

A fifth embodiment is different from the fourth embodiment in that the etching is applied to the Si (100) surface of the silicon wafer instead of the silicon (110) surface, as shown in FIGS. 17 and 18. The used etchant is 32 wt % KOH solution prepared at the temperature of 110° C. The etchant includes Cu additive.

FIG. 17 is a graph showing the surface roughness of an etched Si (100) surface in relation to the Cu content. When the Cu content is less than 0.2 ppm, a smooth etched surface is obtained.

FIG. 18 is a graph showing the surface roughness of the etched Si (100) surface in each solution of #1 to #6 etchant batches of 32 wt % KOH prepared at the temperature of 110° C. The Cu content in each solution of the etchant batches is differentiated from the others. As understood from FIG. 18, when the Cu content is less than 0.1 ppm, the surface roughness of the etched surface can be controlled to approximately 0.2 μm in each etchant batch.

Sixth Embodiment

The etchant used in a sixth embodiment was 32 wt % KOH solution including three kinds of Cu, Mg and Pb. Cu content was 0.021 ppm, Mg content was 0.031 ppm, and Pb content was 0.021 ppm. The etchant was applied to the Si (110) surface of the silicon wafer under the temperature of 110° C. The etching operation was repeated 24 times. The rest of the arrangement and operation is the same as those disclosed in the first embodiment.

Figure 19:
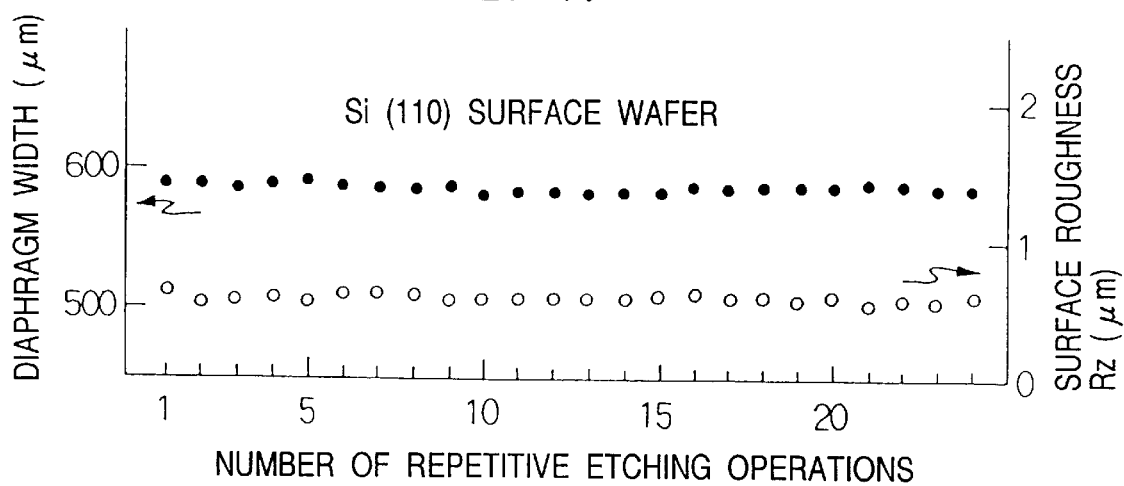
FIG. 19 is a graph showing a relationship between diaphragm width and surface roughness in relation to the number of repetitive etching operations in accordance with a sixth embodiment of the present invention.

FIG. 19 shows the width of the diaphragm portion and the surface roughness of the etched Si (110) surface. In each etching processing, substantially same values were constantly and stably obtained in both the width of the diaphragm portion and the surface roughness.

Seventh Embodiment

When the Si (110) surface of the silicon wafer is etched by alkaline solution, addition of Cu may roughen an etched surface. For example, when Cu is added by 100 ppb or more, the etched surface is roughened as understood from FIG. 13. Accordingly, the Cu content in the alkaline etchant needs to be less than 100 ppb to provide a smooth etched surface.

However, analyzing the Cu amount of the ppb order is not easy. Strictly managing the etchant is very difficult, as a practical problem.

In view of the foregoing, this embodiment provides a method for effectively preventing the etched surface from being roughened.

The used etchant was 32 wt % KOH solution prepared at the temperature of 110° C., containing Cu of 100 ppb or more. When this etchant is applied to the surface of a silicon wafer, a significant amount of Cu deposits on the silicon surface. The Cu deposition has a masking function which possibly roughens the etched surface.

However, according to the inventors of this patent application, adding Mg of the ppm order or more into the etchant is effective to eliminate such a deposition of Cu. When alkaline solution includes Mg, colloidal hydroxide is produced. This colloidal hydroxide absorbs Cu. Thus, Cu no longer gives substantial influence to the etching reaction on the silicon surface.

Figure 20:
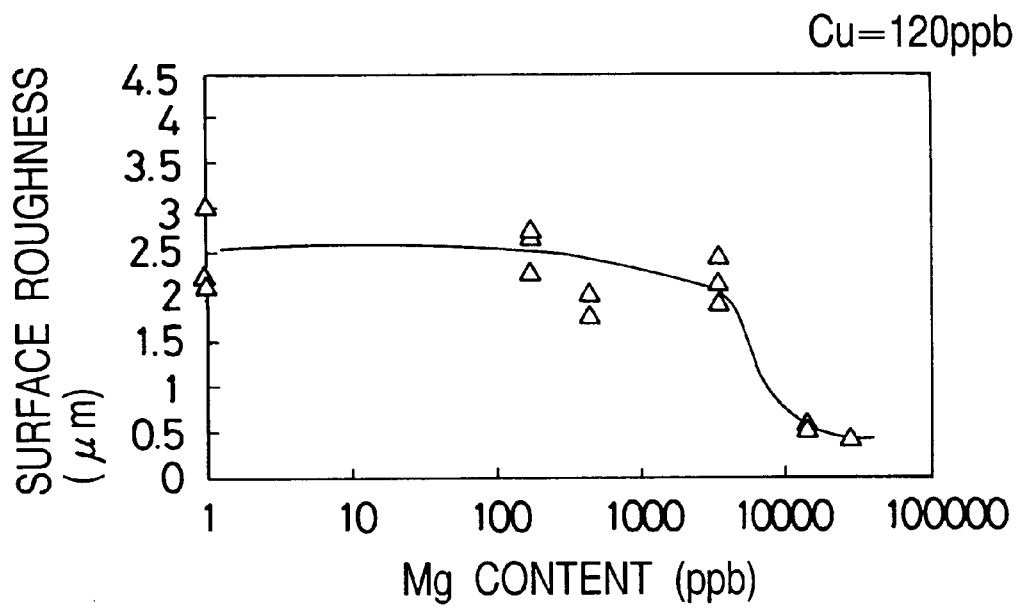
FIG. 20 is a graph showing a relationship between Mg content and surface roughness in accordance with a seventh embodiment of the present invention.
Figure 21:
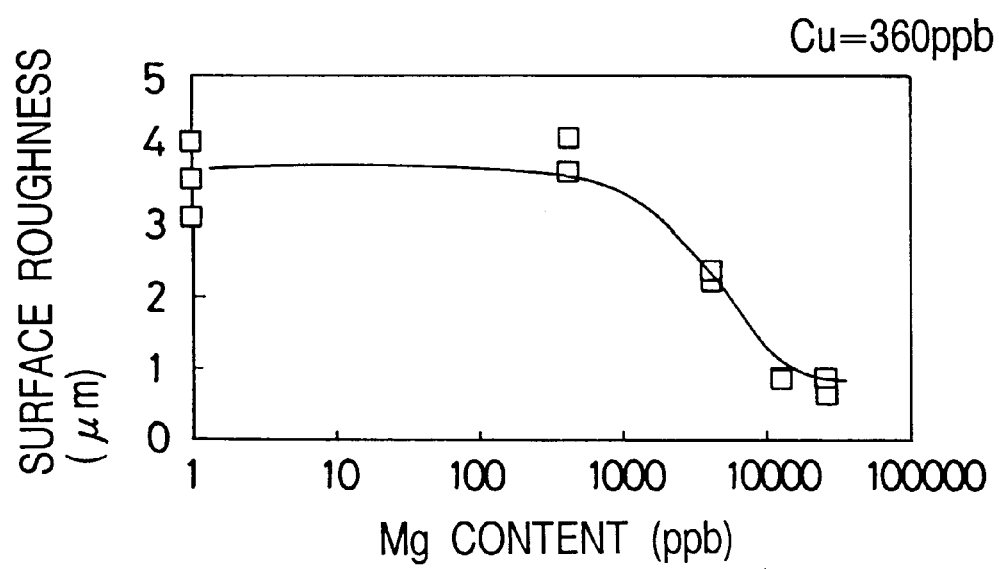
FIG. 21 is a graph showing another relationship between the Mg content and the surface roughness in accordance with the seventh embodiment of the present invention.

FIG. 20 is a graph showing a relationship between the surface roughness and Mg content, obtained when the etchant contains Cu additive of 120 ppb. FIG. 21 is a graph showing a relationship between the surface roughness and Mg content, obtained when the etchant contains Cu additive of 360 ppb. In both cases, an effect of adding Mg was recognized when Mg content exceeds 1 ppm (=1,000 ppb). The surface roughness of an etched surface was reduced to 1 μm when Mg content exceeds 10 ppm.

The above-described method is preferably applied to a three-dimensional machining for a silicon product. For example, a diaphragm of a semiconductor pressure sensor or a cantilever of a semiconductor acceleration sensor can be smoothly and accurately manufactured.

Eighth Embodiment

An eighth embodiment provides another method of reducing Cu contained in the KOH solution. Two electrodes are immersed in the etchant. A predetermined voltage is applied between the two electrodes. According to this method, Cu ions existing in the etchant are collected to one of the two electrode (i.e., a lower potential electrode). Hence, no deposition of Cu occurs on the silicon surface during the etching operation. Cu no longer gives adverse influence to the etching reaction on the silicon surface.

Ninth Embodiment

A ninth embodiment relates to an etching method and an etching apparatus, which will be explained hereinafter with reference to FIGS. 22 to 27.

The Si (110) surface of a silicon material wafer was etched by 32 wt % KOH alkaline solution. Then, the amount of impurity contained in the etchant was measured. The impurity amount was controlled based on the measured value during the etching operation.

Figure 23:
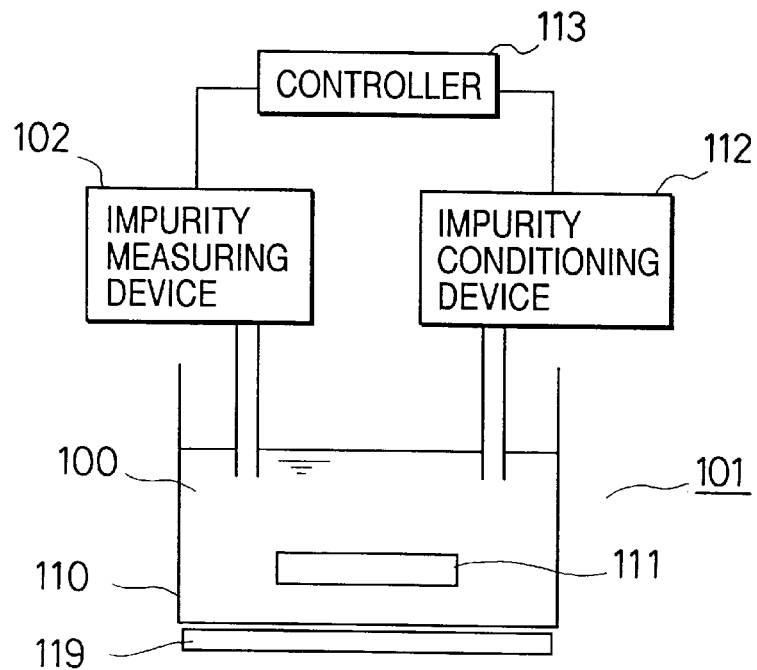
FIG. 23 is a schematic view showing an arrangement of an etching apparatus in accordance with the ninth embodiment of the present invention.

As shown in FIG. 23, an etching apparatus 101 comprises an etching tank 110, an impurity measuring device 102, and an impurity conditioning device 112. The impurity measuring device 102 measures the amount of impurity contained in etchant 100. The impurity conditioning device 112 adjusts the impurity amount based on the measured value detected by the impurity measuring device 102. The etching tank 110 is mounted on a heater 119. The temperature of etchant 100 is controlled to a predetermined value by the heater 119. A controller 113 is interposed between the impurity measuring device 102 and the impurity conditioning device 112.

Figure 24:
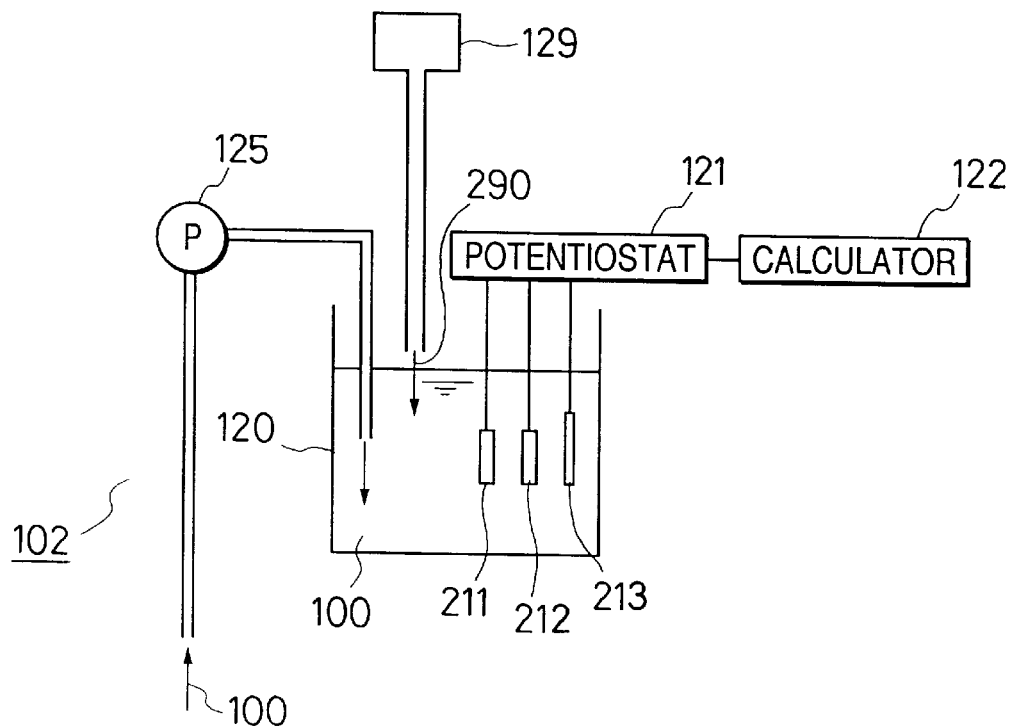
FIG. 24 is a view showing a detailed arrangement of an impurity measuring device incorporated in the etching apparatus of the ninth embodiment.

FIG. 24 shows a detailed arrangement of the impurity measuring device 102. The impurity measuring device 102 comprises an analysis tank 120, a working electrode 211, a counter electrode 213 and a reference electrode 212. The analysis tank 120 stores the etchant 100 sampled from the etching tank 110. The working electrode 211 and the counter electrode 213 cooperatively measure the amount of impurity contained in the etchant 100. The reference electrode 212 determines a reference potential. Furthermore, the impurity measuring device 102 comprises a potentiostat 121, a calculator 122 and an adding device 129. The potentiostat 121 measures a potential-current curve. The calculator 122 calculates the amount of the measured impurity based on a signal sent from the potentiostat 121. The adding device 129 adds pH conditioner 290 into the etchant 100 based on the calculated amount of the measured impurity. Preferably, the pH conditioner 290 is hydrochloric acid (HCl).

The working electrode 211, the counter electrode 212 and the counter electrode 213 are immersed in the etchant 100 stored in the analysis tank 120.

Figure 22:
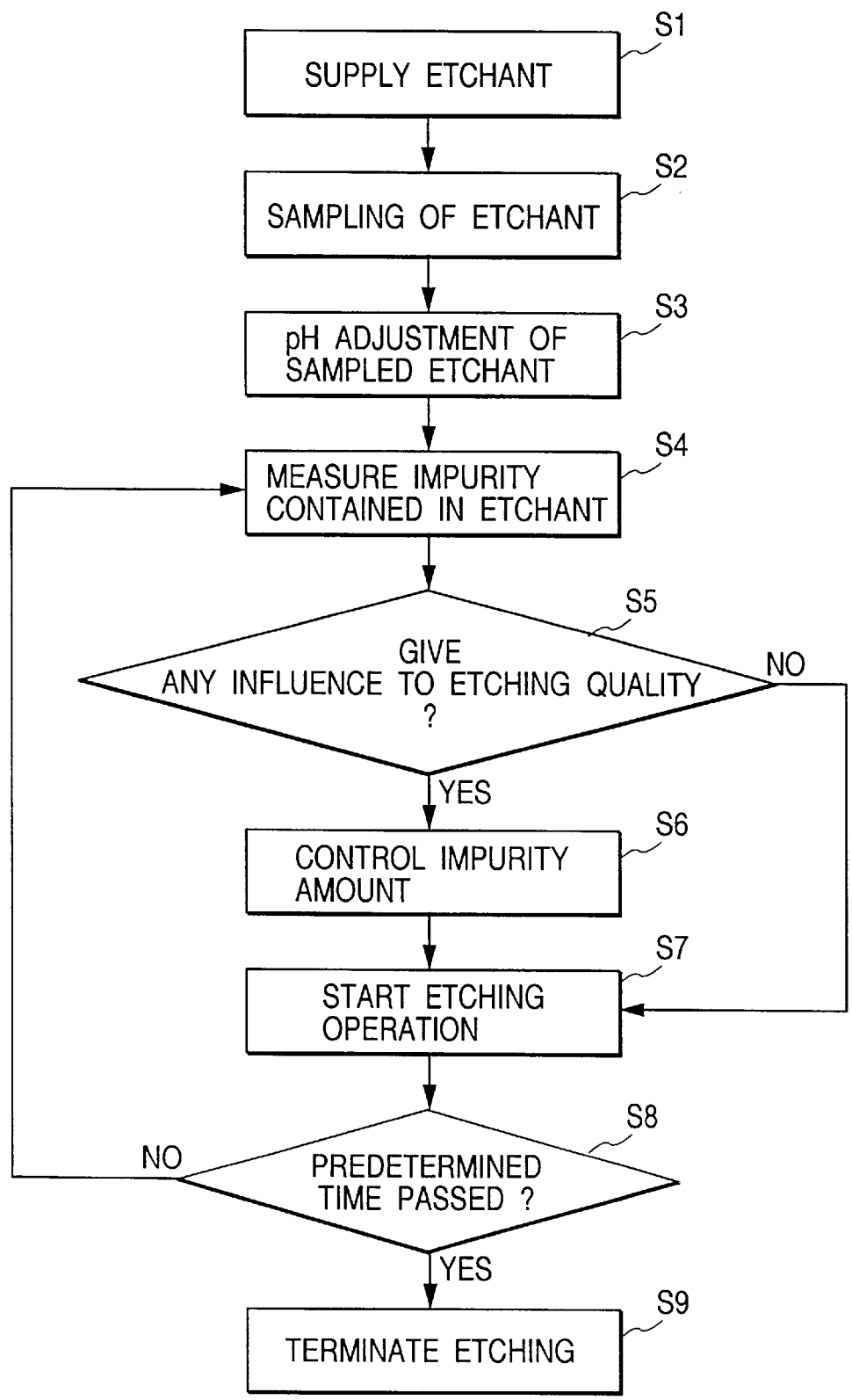
FIG. 22 is a flowchart illustrating the details of an etching method in accordance with a ninth embodiment of the present invention.

Details of the etching method of this embodiment will be explained hereinafter, with reference to FIGS. 22 and 23.

First, the etchant 100 of 260 milliliters was stored in the etching tank 110 (step S1). The impurity measuring device 102 sampled the etchant 100 from the etching tank 110 by an amount of 10 milliliters (step S2). The sampled etchant 100 was stored in the analysis tank 120. Hydrochloric acid (HCl) of 10 milliliters was added from the adding device 129 to adjust the pH of the mixed solution to approximately 4 (step S3).

Next, the impurity amount contained in the etchant 100 was measured by the impurity measuring device 102 (step S4).

More specifically, a potential-current curve was measured to detect a current peak intensity applied to the impurity. The measured etchant 100 was compared with master liquid to obtain an intensity ratio. The impurity contained in the master liquid was 50 ppb. Finally, the kind of the impurity was identified and its content was measured.

As a result of the measurement, Cu and Pb contained in the etchant were less than 50 ppb. The measured value 50 ppb is too small for the impurity to give adverse influence to the etching quality.

Figure 26:
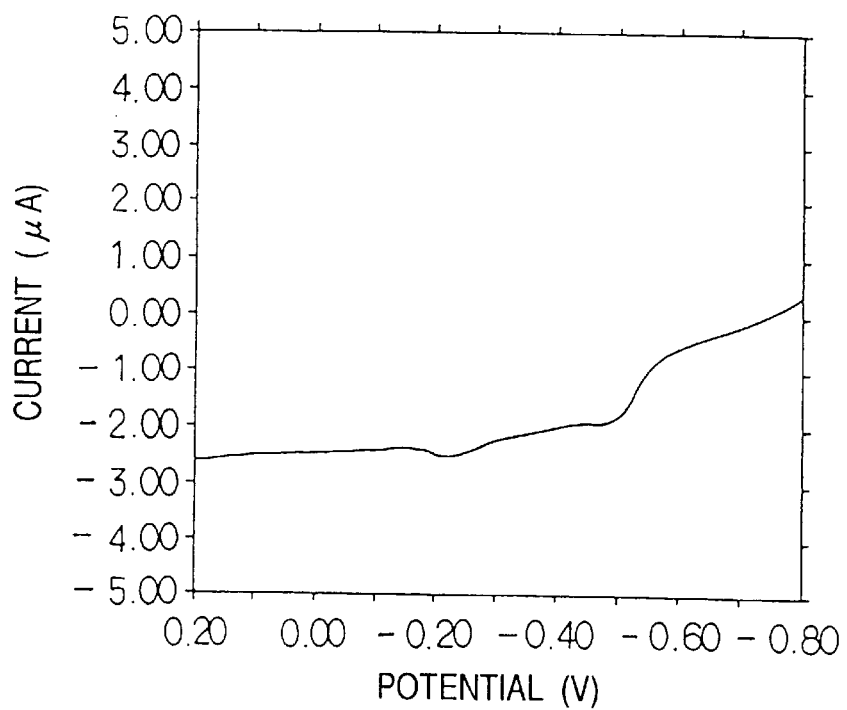
FIG. 26 is a graph showing a potential-current curve obtained by the impurity measuring device incorporated in the etching apparatus of the ninth embodiment.

FIG. 26 shows a potential-current curve obtained by a stripping voltammetry method. The sampled etchant was stirred during the measurement of the impurity according to the stripping voltammetry method. The curve shown in FIG. 26 is smooth. This means that no impurity was contained in the measured etchant sample (i.e., "NO" in step S5).

Then, a silicon material 111 is put into the etching tank 110 by using an appropriate shifting device (not shown). An etching operation is started (step S7). During the etching operation, the temperature of the etchant 100 was kept at 100° C. by the heater 119.

After a first five-minute period of the etching operation has passed, the impurity measuring device 2 was activated. Then, the kind of the impurity contained in the etchant 100 was identified and its content was measured in the above-described manner (steps S8→S4→S5). As a result, Cu and Pb contained in the etchant were less than 50 ppb. As the content 50 ppb is too small for the impurity to give adverse influence to the etching quality, the etching operation was continued without any adjustment (steps S5→S7→S8).

After a first fifteen-minute period of the etching operation has passed, the impurity measuring device 2 was activated again. Then, the kind of the impurity contained in the etchant 100 was identified and its content was measured in the above-described manner (steps S8→S4→S5). As a result, Cu content was 300 ppb. The measured value 300 ppb is sufficiently large for Cu to give adverse influence to the etching quality (i.e., "YES" in step S5). Thus, in response to this detection, the controller 113 activated the impurity conditioning device 112.

Then, the impurity conditioning device 112 added Mg of 20 ppm to the etchant 100 stored in the etching tank 110 (step S6). With the addition of 20 ppm Mg, the etchant 100 was acceptable for the etching operation. No adverse influence was given to the etching quality. It is believed that Cu in the etchant was absorbed by the colloidal hydroxide of Mg. Thus, the substantial amount of Cu was reduced.

The above-described operations were repeated appropriately until the etching operation of the silicon material 111 was completely finished (steps S8 and S9). The etched surface of silicon material 111, obtained by the above-described etching operations, was excellent in both the surface roughness and the etching rate.

Hereinafter, the etching quality and influence of the impurity will be explained with reference to Table 1.

Table 1 shows various elements which may be contained in the etchant. The used etchant was 32 wt % KOH solution containing these elements in the range of 50 to 2,000 ppb. Both of the Si (110) surface and the Si (100) surface were etched by the etchant at the temperature of 110° C. Table 1 summarizes the result of the etching operations.

| Element | Roughened Surface | Decreased Etching Rate |
|---|---|---|
| Ca | | |
| Mg | | o |
| Al | | |
| Zn | | |
| Fe | | |
| Ni | | |
| Ti | | |
| Cr | | |
| Si | | |
| Pb | | o |
| Cu | o | o |
| Ag | | |
| Pt | | |
| Pd | | |
| Ge | | |

As shown in the table 1, the roughened surface (refer to FIGS. 15A and 15B) was recognized when the impurity contained in the etchant was Cu. The etching rate was reduced when the impurity contained in the etchant was Mg, Pb or Cu.

Next, the following experiments were conducted to confirm the performances of the impurity measuring device 102 and the impurity conditioning device 112 of the etching apparatus 101 used in this embodiment.

Figure 25:
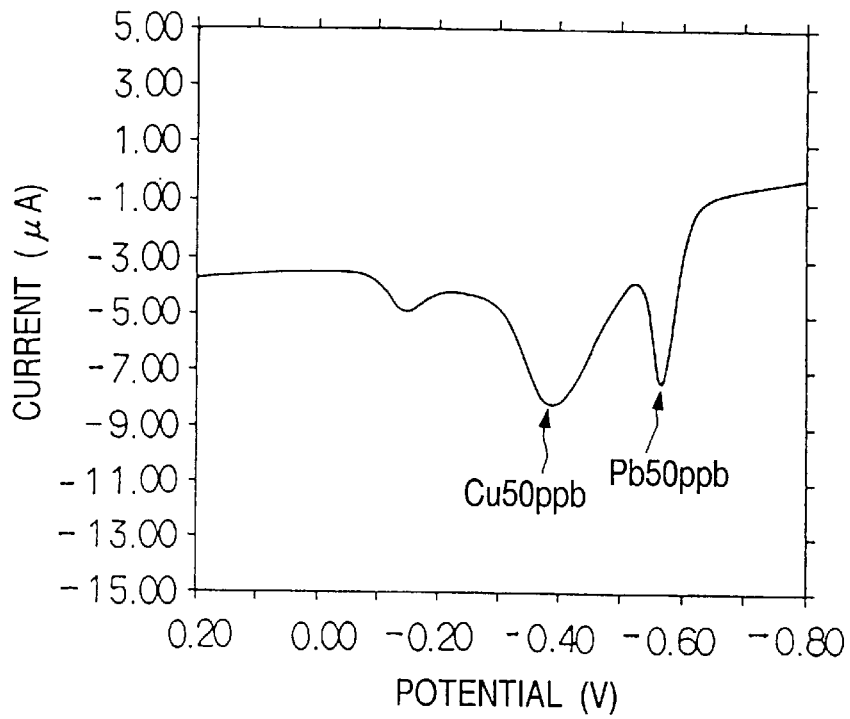
FIG. 25 is a graph showing a potential-current curve obtained by the impurity measuring device incorporated in the etching apparatus of the ninth embodiment.

Using metallic standard liquid for atomic absorption analysis, Cu and Pb of 50 ppb are added to 32 wt % KOH solution. The thus adjusted etchant of 260 milliliters was stored in the etching tank 110 of the etching apparatus 101. The impurity measuring device 102 was activated to sample 10 milliliters from the etchant. A measurement was conducted according to the procedure explained in the above-described etching method. FIG. 25 shows an obtained potential-current curve. Experiment A)

Figure 27:
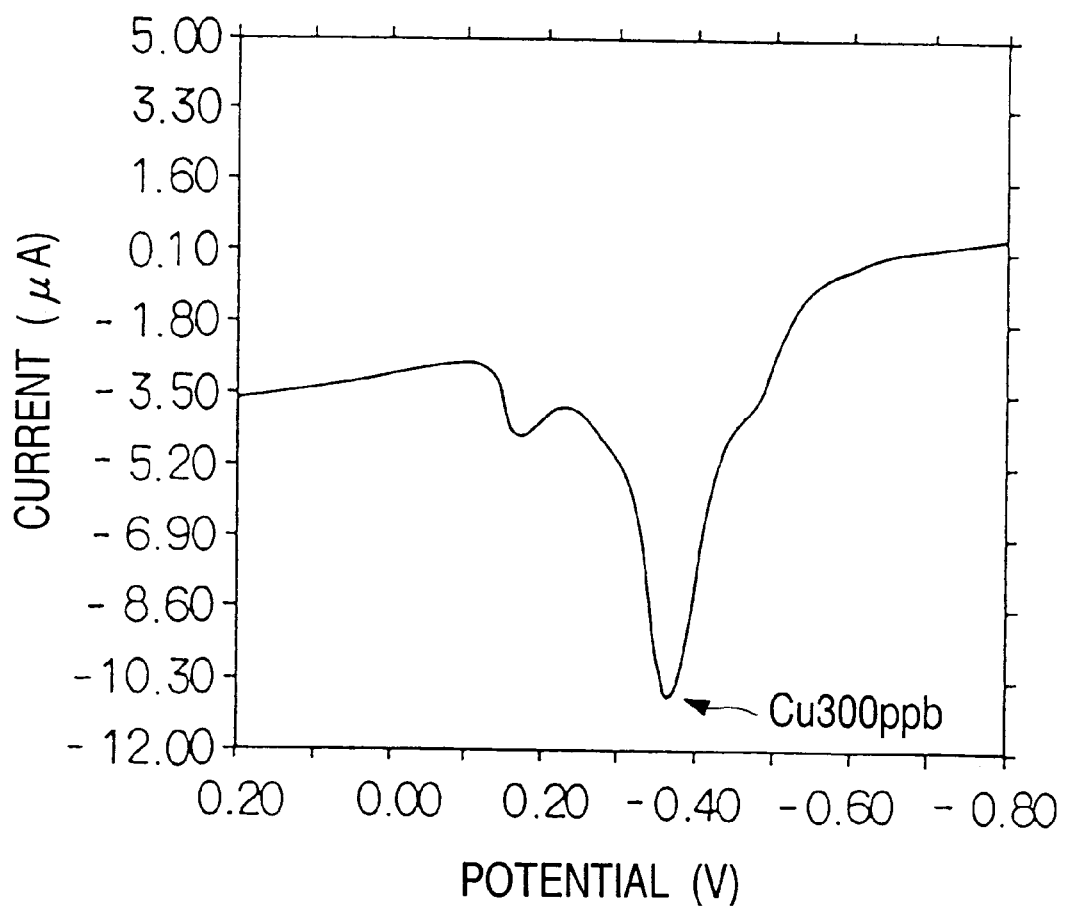
FIG. 27 is a graph showing a potential-current curve obtained by the impurity measuring device incorporated in the etching apparatus of the ninth embodiment.

Furthermore, using metallic standard liquid for atomic absorption analysis, Cu of 300 ppb is added to 32 wt % KOH solution. The thus adjusted etchant of 260 milliliters was stored in the etching tank 110 of the etching apparatus 101. The impurity measuring device 102 was activated to sample 10 milliliters from the etchant. A measurement was conducted according to the procedure explained in the above-described etching method. FIG. 27 shows an obtained potential-current curve. (Experiment B)

The silicon material 111 used in this embodiment was put into the etching tank 110 to start an etching operation. The surface roughness of a resultant etched surface was approximately 5 $\mu$m. The etching quality was not good. (Experiment C)

After that, the impurity conditioning device 112 was activated to add Mg of 20 ppm into the etching tank 110. Using the etchant thus adjusted, the silicon material 111 was etched. The surface roughness of a resultant etched surface was approximately 0.6 $\mu$m. (Experiment D)

From the above-described experiments A through C, it is confirmed that the impurity measuring device incorporated in the etching apparatus of this embodiment can detect the impurity finely.

From the above-described experiments C and D, it is confirmed that the impurity conditioning device incorporated in the etching apparatus of this embodiment can prevent the etching quality from being lowered.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. An etching method for etching a silicon wafer, comprising the steps of:
    forming an etching mask on a silicon surface;
    etching a silicon wafer covered by the etching mask by using alkaline etchant containing metallic component suppressing the etching reaction and adsorbable on a silicon surface and controlling the content of said metallic component so as to form a groove on the silicon surface.

2. The etching method in accordance with claim 1, wherein an etching rate is in the order of $\mu$m/min.

3. The etching method in accordance with claim 1, wherein said metallic component has an oxidation-reduction potential higher than that of hydrogen produced during the etching operation.

4. The etching method in accordance with claim 3, wherein said metallic component is Cu.

5. The etching method in accordance with claim 1, wherein said metallic component has an oxidation-reduction potential lower than that of hydrogen produced during the etching operation but higher than that of Ni, and said metallic component causes repetitive ionization and deposition.

6. The etching method in accordance with claim 5, wherein said metallic component is Pb.

7. The etching method in accordance with claim 1, wherein said metallic component forms colloidal hydroxide in said alkaline etchant.

8. The etching method in accordance with claim 7, wherein said metallic component is Mg.

9. The etching method in accordance with claim 1, wherein said alkaline etchant contains potassium hydroxide (KOH).

10. The etching method in accordance with claim 4, wherein the content of Cu is controlled to a value lower than 0.1 ppm.

11. The etching method in accordance with claim 4, wherein the content of Cu is controlled to a value higher than 0.3 ppm.

12. The etching method in accordance with claim 6, wherein the content of Pb is controlled to a range of 0.1 ppm to 2 ppm.

13. The etching method in accordance with claim 8, wherein the content of Mg is controlled to a value lower than 1 ppm.

14. The etching method in accordance with claim 8, wherein the content of Mg is controlled to a value higher than 1 ppm.

15. The etching method in accordance with claim 4, wherein Mg is added to said alkaline etchant when the content of Cu exceeds 100 ppb.

16. The etching method in accordance with claim 1, wherein said metallic component contained in said alkaline etchant is measured, and the content of said metallic component is controlled based on a measured value during the etching operation.

17. The etching method in accordance with claim 16, wherein the temperature and concentration of said alkaline etchant are controlled.

18. The etching method in accordance with claim 16, wherein said metallic component is measured by a stripping voltammetry method.

19. The etching method in accordance with claim 18, wherein the measurement of said metallic component according to said stripping voltammetry method is performed by sampling said alkaline etchant, adjusting pH of said sampled etchant to a range of pH 2 to 6 by adding pH conditioner, and measuring said metallic component contained in said sampled alkaline etchant.

20. The etching method in accordance with claim 19, wherein said sampled etchant is stirred during the measurement of said metallic component according to said stripping voltammetry method.

21. The etching method in accordance with claim 19, wherein said alkaline etchant contains potassium hydroxide (KOH), and said pH conditioner is hydrochloric acid (HCl).

22. The etching method in accordance with claim 16, wherein said measured metallic component is selected from the group consisting of Cu, Pb and Mg.

23. The etching method in accordance with claim 16, wherein said measured metallic component is Cu, and Mg is added to said alkaline etchant based on a measured value of Cu.

24. An etching method for etching a silicon material by using alkaline etchant, comprising the steps of:
    measuring the content of impurity contained in said alkaline etchant; and
    controlling the content of said impurity based on a measured value during an etching operation, wherein the impurity is being added to the alkaline etchant.

25. The etching method in accordance with claim 24, wherein the temperature and concentration of said alkaline etchant are controlled.

26. The etching method in accordance with claim 24, wherein said impurity is measured by a stripping voltammetry method.

27. The etching method in accordance with claim 26, wherein the measurement of said impurity according to said stripping voltammetry method is performed by sampling said alkaline etchant, adjusting pH of said sampled etchant to a range of pH 2 to 6 by adding pH conditioner, and measuring said impurity contained in said sampled alkaline etchant.

28. The etching method in accordance with claim 27, wherein said sampled etchant is stirred during the measurement of said impurity according to said stripping voltammetry method.

29. The etching method in accordance with claim 27, wherein said alkaline etchant contains potassium hydroxide (KOH), and said pH conditioner is hydrochloric acid (HCl).

30. The etching method in accordance with claim 24, wherein said measured impurity is selected from the group consisting of Cu, Pb and Mg.

31. The etching method in accordance with claim 24, wherein said measured impurity is Cu, and Mg is added to said alkaline etchant based on a measured value of Cu.

32. The etching method in accordance with claim 2, wherein said metallic component in said etchant exists as a minus ion compound containing oxygen.

33. The etching method in accordance with claim 32, wherein said metallic component is reduced by hydrogen produced during the etching operation and appears as a deposit on the silicon surface.

34. The etching method in accordance with claim 33, wherein said metallic component is Cu.

35. The etching method in accordance with claim 32, wherein said metallic component causes repetitive ionization and deposition on the silicon wafer surface.

36. The etching method in accordance with claim 35, wherein said metallic component is Pb.

37. The etching method in accordance with claim 2, wherein said metallic component in said etchant exists as hydroxide.

38. The etching method in accordance with claim 37, wherein said metallic component exists as a colloidal hydroxide on the silicon surface.

39. The etching method in accordance with claim 38, wherein said metallic component is Mg.

* * * * *